US012672464B2

(12) United States Patent
Wang

(10) Patent No.: US 12,672,464 B2
(45) Date of Patent: Jun. 30, 2026

(54) DISPLAY PANEL AND DISPLAY DEVICE

(71) Applicant: Wuhan China Star Optoelectronics Semiconductor Display Technology Co., Ltd., Wuhan (CN)

(72) Inventor: Bo Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 710 days.

(21) Appl. No.: 17/600,387

(22) PCT Filed: Sep. 8, 2021

(86) PCT No.: PCT/CN2021/117259
§ 371 (c)(1),
(2) Date: Sep. 30, 2021

(87) PCT Pub. No.: WO2022/247056
PCT Pub. Date: Dec. 1, 2022

(65) Prior Publication Data
US 2024/0049563 A1 Feb. 8, 2024

(30) Foreign Application Priority Data

May 25, 2021 (CN) ........................ 202110571823.X

(51) Int. Cl.
*H10K 59/80* (2023.01)
(52) U.S. Cl.
CPC . *H10K 59/80521* (2023.02); *H10K 59/80523* (2023.02); *H10K 59/80524* (2023.02); *H10K 59/875* (2023.02)

(58) Field of Classification Search
CPC ....... H10K 59/10–1315; H10K 59/875; H10K 59/879; H10K 59/80524; H10K 59/80523
See application file for complete search history.

(56) References Cited

U.S. PATENT DOCUMENTS

| | | | |
|---|---|---|---|
| 2011/0050657 A1* | 3/2011 | Yamada ................. | H10K 50/84 |
| | | | 361/679.01 |
| 2013/0002133 A1* | 1/2013 | Jin ........................ | H10K 59/128 |
| | | | 313/511 |
| 2019/0081255 A1 | 3/2019 | Kim | |

FOREIGN PATENT DOCUMENTS

| | | |
|---|---|---|
| CN | 108053762 | 5/2018 |
| CN | 108550610 | 9/2018 |
| CN | 110323264 | 10/2019 |
| CN | 110352494 | 10/2019 |
| CN | 110444679 | 11/2019 |
| CN | 110610973 | 12/2019 |
| CN | 113270465 | 8/2021 |

* cited by examiner

*Primary Examiner* — Jesse Y Miyoshi

(57) ABSTRACT

The display panel includes a planar display area and a curved display area. The display panel includes a light emitting layer, a cathode layer, and an optical coupling layer. A thickness of at least one of the cathode layer and the optical coupling layer in the curved display area is different from a thickness of at least one of the cathode layer and the optical coupling layer in the planar display area, so that a luminous efficiency of the light emitting layer in the curved display area is greater than a luminous efficiency of the light emitting layer in the planar display area. The brightness of the curved display area is improved, and the problem of low brightness of the display panel in the curved display area is improved.

16 Claims, 10 Drawing Sheets

A substrate is provided, a driving circuit layer and an anode layer disposed on the driving circuit layer are formed on the substrate, and a light emitting layer is deposited on the anode layer by using a first mask    —— S10 a first cathode layer is deposited on the light emitting layer by using the first mask    —— S20 a second cathode layer is deposited on the first cathode layer by using a second mask    —— S30 an optical coupling layer is deposited on the first cathode layer and the second cathode layer using the first mask    —— S40

FIG. 11

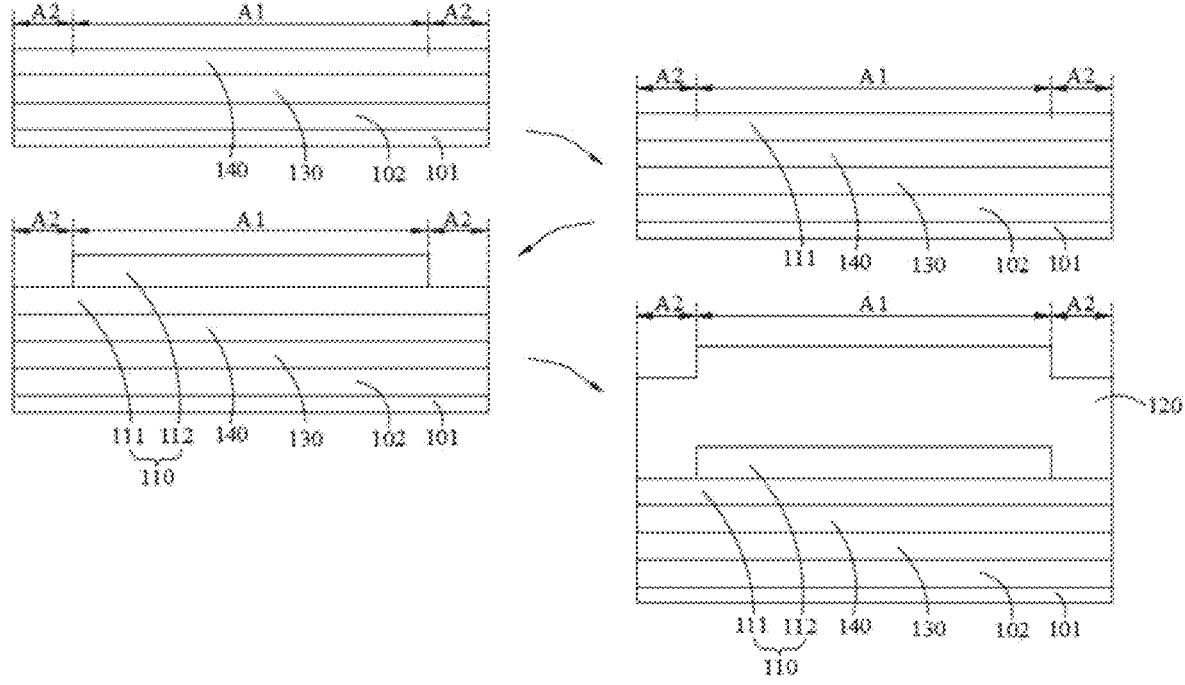

FIG. 12

DISPLAY PANEL AND DISPLAY DEVICE

RELATED APPLICATIONS

This application is a National Phase of PCT Patent Application No. PCT/CN2021/117259 having International filing date of Sep. 8, 2021, which claims the benefit of priority of Chinese Patent Application No. 202110571823.X filed on May 25, 2021. The contents of the above applications are all incorporated by reference as if fully set forth herein in their entirety.

FIELD AND BACKGROUND OF THE INVENTION

This disclosure relates to a field of display technology, and more particularly, to a display panel and a display device.

Organic light-emitting diode (OLED) devices are devices rendering organic materials emit light under the action of an electric field. OLED display panels comprising the OLED devices have the characteristics of wide viewing angles, short responding times, high contrast, and ultra-thinness and flexible display. The OLED display panels can be classified into bottom-emitting OLED display panels and top-emitting OLED display panels according to different light source emitting positions. Compared with the bottom-emitting OLED display panel, the top-emitting OLED display panels have the characteristics of larger aperture ratios and higher display color purity, so that the top-emission OLED display panels have a better development prospect.

Technical Problem

Since the top-emission OLED display panel uses an optical microcavity to improve the luminous efficiency in the vertical direction, the brightness of the top-emission OLED display panel is significantly reduced at other viewing angles, and color shift occurs at the same time. Currently, a curved OLED display panel includes a planar display area and a curved display area disposed on a side of the planar display area. Since the curved OLED display panel is a Lambert illuminant, the luminous intensity is proportional to the cosine of an angle of the normal of a surface light source. When viewing the curved OLED display panel, the angle between the curved display area and the normal of the surface light source is larger than that of the planar display area. Thus, the brightness of the curved display area is lower than that of the planar display area.

As mentioned above, the conventional curved OLED display panel has the problem that the brightness of the curved display area is lower than that of the planar display area. Therefore, it is necessary to provide a display panel and a display device to improve this problem.

SUMMARY OF THE INVENTION

The embodiments of the disclosure provide a display panel and a display device, which are configured to solve the problem that the brightness of the curved display area of the conventional curved OLED display panel is lower than that of the planar display area.

Technical Solutions

An embodiment of the disclosure provides a display panel that includes a planar display area and a curved display area disposed on at least one side of the planar display area. The display panel includes:

a light emitting layer;

a cathode layer covering the light emitting layer; and an optical coupling layer disposed on the cathode layer.

A thickness of at least one of the cathode layer and the optical coupling layer in the curved display area is different from a thickness of at least one of the cathode layer and the optical coupling layer in the planar display area, and a luminous efficiency of the light emitting layer in the curved display area is greater than a luminous efficiency of the light emitting layer in the planar display area.

In one embodiment of the disclosure, a thickness of the cathode layer in the curved display area is less than or equal to a thickness of the cathode layer in the planar display area.

In one embodiment of the disclosure, a difference between the thickness of the cathode layer in the planar display area and the thickness of the cathode layer in the curved display area is greater than or equal to 2 nm and less than or equal to 10 nm.

In one embodiment of the disclosure, at least one recess is defined by a portion of the cathode layer corresponding to the curved display area.

In one embodiment of the disclosure, the cathode layer comprises:

a first cathode layer disposed in the planar display area and the curved display area;

a second cathode layer disposed between the first cathode layer and the optical coupling layer and disposed in the planar display area.

A thickness of the first cathode layer is greater than or equal to 8 nm and less than or equal to 20 nm, and a thickness of the second cathode layer is greater than or equal to 2 nm and less than or equal to 10 nm.

In one embodiment of the disclosure, a material of the first cathode layer is the same as a material of the second cathode layer.

In one embodiment of the disclosure, a material of the first cathode layer is different from a material of the second cathode layer, a refractive index of the first cathode layer is less than or equal to a refractive index of the second cathode layer, or a refractive index of the first cathode layer is greater than or equal to a refractive index of the second cathode layer.

In one embodiment of the disclosure, the material of the first cathode layer includes at least one of ytterbium, calcium, magnesium and silver, and the material of the second cathode layer includes at least one of ytterbium, calcium, magnesium and silver.

In one embodiment of the disclosure, a thickness of the optical coupling layer in the curved display area is greater than or equal to a thickness of the optical coupling layer in the planar display area.

In one embodiment of the disclosure, a difference between the thickness of the optical coupling layer in the curved display area and the thickness of the optical coupling layer in the planar display area is greater than or equal to 10 nm.

In one embodiment of the disclosure, a protrusion is disposed on the portion of the optical coupling layer on a side away from the cathode layer corresponding to the curved display area.

In one embodiment of the disclosure, the optical coupling layer comprises:

a first optical coupling layer disposed on the curved display area;

a second optical coupling layer disposed on the curved display area and the planar display area.

The first optical coupling layer is disposed between the second optical coupling layer and the cathode layer, or the first optical coupling layer is disposed on a side of the second optical coupling layer away from the cathode layer.

In one embodiment of the disclosure, a thickness of the first optical coupling layer is greater than or equal to 10 nm and less than or equal to 60 nm, and a thickness of the second optical coupling layer is greater than or equal to 50 nm and less than or equal to 200 nm.

In one embodiment of the disclosure, a material of the first optical coupling layer is the same as a material of the second optical coupling layer.

In one embodiment of the disclosure, a material of the first optical coupling layer is different from a material of the second optical coupling layer, a refractive index of the first optical coupling layer is greater than or equal to a refractive index of the second optical coupling layer, or a refractive index of the first optical coupling layer is less than or equal to a refractive index of the second optical coupling layer.

In one embodiment of the disclosure, the material of the first optical coupling layer and the material of the second optical coupling layer are both organic small molecule hole transport materials.

The embodiment of the disclosure further provides a display device, the display device comprises a display panel. The display panel comprises a planar display area and a curved display area disposed on at least one side of the planar display area. The display panel comprises:

a light emitting layer;

a cathode layer covering the light emitting layer; and an optical coupling layer disposed on the cathode layer.

A thickness of at least one of the cathode layer and the optical coupling layer in the curved display area is different from a thickness of at least one of the cathode layer and the optical coupling layer in the planar display area, and a luminous efficiency of the light emitting layer in the curved display area is greater than a luminous efficiency of the light emitting layer in the planar display area.

In one embodiment of the disclosure, a thickness of the cathode layer in the curved display area is less than or equal to a thickness of the cathode layer in the planar display area.

In one embodiment of the disclosure, a difference between the thickness of the cathode layer in the planar display area and the thickness of the cathode layer in the curved display area is greater than or equal to 2 nm and less than or equal to 10 nm.

In one embodiment of the disclosure, a recess is defined by a portion of the cathode layer corresponding to the curved display area.

Beneficial Effects

The disclosure provides a display panel and a display device. The display panel includes a light emitting layer, a cathode layer, and an optical coupling layer. A thickness of at least one of the cathode layer and the optical coupling layer in the curved display area is different from a thickness of at least one of the cathode layer and the optical coupling layer in the planar display area. The luminous efficiency of the light emitting layer in the curved display area is greater than the luminous efficiency in the planar display area, thereby improving the brightness of the curved display area. The problem that the brightness of the display panel in the curved display area is lower than the brightness of the planar display area is improved.

BRIEF DESCRIPTION OF THE SEVERAL VIEWS OF THE DRAWINGS

In order to more clearly illustrate the embodiments of the disclosure or the technical solutions in the prior art, the following briefly introduces the accompanying drawings used in the embodiments. Obviously, the drawings in the following description merely show some of the embodiments of the disclosure. As regards one of ordinary skill in the art, other drawings can be obtained in accordance with these accompanying drawings without making creative efforts.

FIG. 11 is a flowchart of a manufacturing method of the display panel according to the second embodiment of the disclosure.

FIG. 12 is a schematic flowchart of the manufacturing method of the display panel according to the second embodiment of the disclosure.

DESCRIPTION OF SPECIFIC EMBODIMENTS OF THE INVENTION

Figure 1:
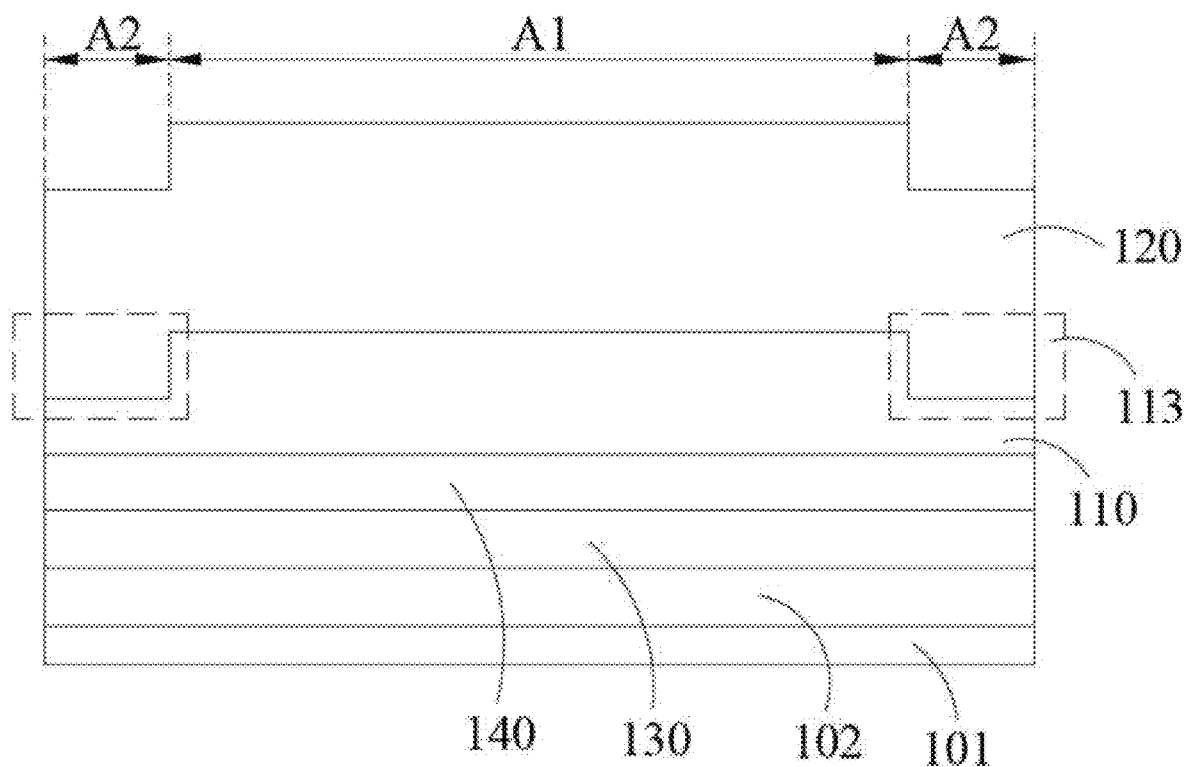
FIG. 1 is a structural schematic diagram of a display panel according to a first embodiment of the disclosure.

This description of the exemplary embodiments is intended to be read in connection with the accompanying drawings, which are to be considered part of the entire written description. In the description, terms such as "lower", "upper", "front", "behind", "left", "right", "inside", "outside", and "side", as well as derivatives thereof, should be construed to refer to the orientation as then described or as shown in the drawing under discussion. The elements mentioned in the disclosure, such as the first, second, etc., are only to better distinguish and express different components. Referring to the drawings of the disclosure, similar elements are labeled with the same number.

The disclosure will be further described below in combination with the accompanying drawings and specific embodiments.

An embodiment of the disclosure provides a display panel including a planar display area A1 and a curved display area A2 disposed on at least one side of the planar display area. The display panel includes a light emitting layer 140, a cathode layer 110 and an optical coupling layer 120, and the cathode layer 110 covers the light emitting layer 140. The optical coupling layer 120 is arranged on the cathode layer 110. A thickness of at least one of the cathode layer 110 and the optical coupling layer 120 in the curved display area A2 is different from that in the planar display area A1. The luminous efficiency of the light emitting layer 140 in the curved display area A2 is greater than the luminous efficiency in the planar display area A1, which can improve the brightness of the curved display area A2 and reduce the brightness difference between the curved display area A2 and the planar display area A1 at a large viewing angle. The problem that the brightness of the display panel in the curved display area A2 is lower than the brightness in the planar display area A1 is improved.

In one embodiment, as shown in FIG. 1, a structural schematic diagram of a display panel according to a first embodiment of the disclosure is shown. The display panel includes a display area and a non-display area surrounding the display area (not shown in the figure). The display area includes a planar display area A1 and a curved display area A2 disposed on the left and right sides of the planar display area A1, and a cross section of the curved display area A2 along a thickness direction of the display panel is curved. In practical application, the curved display area A2 is not only limited to the left and right sides of the planar display area A1, but also can be disposed on any one side or opposite sides of the upper, lower, left, and right sides of the planar display area A1, or arranged around the planar display area A1 (the so-called waterfall screen).

Specifically, the display panel is a top-emitting OLED display panel. The display panel further includes a substrate 101, a driving circuit layer 102, an anode layer 130 and the light-emitting layer 140. The driving circuit layer 102 is arranged on the substrate 101. The anode layer 130 is arranged on the driving circuit layer 102 and is disposed on a side of the cathode layer 110 away from the optical coupling layer 120. The light emitting layer 140 is disposed between the anode layer 130 and the cathode layer 110. The anode layer 130 is a total reflection electrode structure, the cathode layer 110 is a semi-transparent electrode structure, and the anode layer 130, the light-emitting layer 140 and the cathode layer 110 form an optical microcavity structure.

In one embodiment, the anode layer 130 is a laminated structure formed by sequentially laminating indium tin oxide, silver, and indium tin oxide materials from bottom to top. A thickness of indium tin oxide at the bottom of the laminated structure is 50 nm, a thickness of silver at the middle of the laminated structure is 150 nm, and a thickness of indium tin oxide at the top of the laminated structure is 50 nm.

In practical applications, indium tin oxide can also be replaced by other transparent conductive materials, such as indium zinc oxide, zinc oxide or gallium zinc oxide. Silver can also be replaced by other conductive and opaque metal materials, such as copper, aluminum or molybdenum. It is only necessary to make the anode layer 130 a laminated structure formed by sequentially stacking transparent conductive electrodes and metal electrodes. The thickness of indium tin oxide at the bottom of the laminated structure can also be 10 nm, 30 nm, 70 nm or 100 nm, and which ranges from 10 nm to 100 nm. The thickness of the silver in the middle of the laminated structure can also be 100 nm, 130 nm, 170 nm or 200 nm, and which ranges from 100 nm to 200 nm. The thickness of the indium tin oxide on the top layer can also be 10 nm, 30 nm, 70 nm or 100 nm, which ranges from 10 nm to 100 nm.

Further, the thickness of the cathode layer 110 in the curved display area A2 is less than or equal to the thickness of the cathode layer 110 in the planar display area A1.

In one embodiment, as shown in FIG. 1, the thickness of the cathode layer 110 in the curved display area A2 is less than the thickness of the cathode layer 110 in the planar display area A1. The microcavity effect of the microcavity structure in the curved display area A2 is reduced, so that the microcavity effect of the curved display area A2 is weaker than that of the planar display area A1, thereby improving the luminous efficiency of the light emitting layer 140 in the curved display area A2. The luminous efficiency of the light emitting layer 140 in the curved display area A2 is greater than the luminous efficiency in the planar display area A1, thereby improving the brightness of the curved display area A2 at a large viewing angle. Meanwhile, the transmittance of the cathode layer 110 is inversely proportional to the thickness of the cathode layer 110, so that the transmittance of the cathode layer 110 in the curved display area A2 can be greater than the transmittance of the cathode layer 110 in the planar display area A1. The brightness of the display panel in the curved display area A2 is further improved, thereby improving the problem that the brightness of the display panel in the curved display area A2 is lower than that of the planar display area A1

Figure 2:
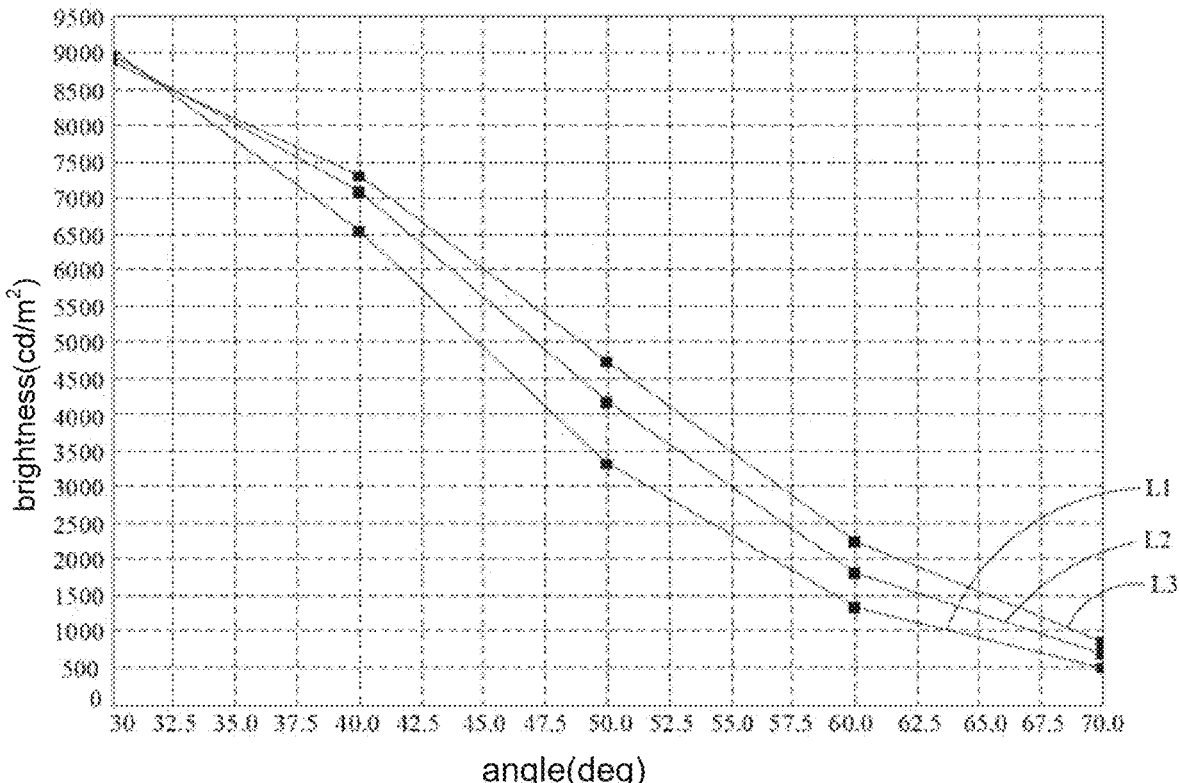
FIG. 2 is a simulated brightness curve diagram of a curved display area of an embodiment of the disclosure under different thicknesses of a cathode layer and different observation angles.

Combining FIG. 2 and Table 1, a simulated brightness curve diagram of a curved display area of an embodiment of the disclosure under different thicknesses of a cathode layer and different observation angles is shown in FIG. 2, and a table of simulated brightness values of the curved display area at different thicknesses of the cathode layer is shown in Table 1. The observation angle is an angle between an observation visual angle and a normal of the display panel. In this experiment, the thickness of the optical coupling layer 120 in the curved display area A2 is a fixed value of 150 nm. This experiment comprises three control groups, which include a first group L1, the thickness of the cathode layer 110 in the curved display area A2 is 13 nm; a second group L2, the thickness of the cathode layer 110 in the curved display area A2 is 10 nm; and a third group L3, the thickness of the cathode layer 110 in the curved display area A2 is 8 nm.

Referring to FIG. 2, as the observation angle changes from 30° to 30°; the brightness of the three control groups gradually decreases with the observation angle increased gradually. Besides, the brightness of the first group L1 is always less than the brightness of the second group L2, and the brightness of the second group L2 is always less than the brightness of the third group L3. Referring to Table 1, when the observation angle is 50°, the brightness of the first group L1 is 3300 cd/m$^2$, the brightness of the second group L2 is 4180 cd/m$^2$, and the brightness of the third group L3 is 4750 cd/m$^2$. It can be seen that the less the thickness of the cathode layer 110 in the curved display area A2, the greater the brightness of the curved display area A2.

TABLE 1

| a table of simulated brightness values of the curved display area at different thicknesses of the cathode layer | |
| --- | --- |
| Thickness of cathode layer in curved display area/nm | Brightness (observation angle 50°)/cd/m$^2$ |
| 13 | 3300 |
| 10 | 4180 |
| 8 | 4750 |

Further, a difference between the thickness of the cathode layer 110 in the planar display area A1 and the thickness of the cathode layer 110 in the curved display area A2 is greater than or equal to 2 nm and less than or equal to 10 nm.

In one embodiment, the difference between the thickness of the cathode layer 110 in the planar display area A1 and the thickness of the cathode layer 110 in the curved display area A2 is 6 nm. In practical applications, the difference between the thickness of the cathode layer 110 in the planar display area A1 and the thickness of the cathode layer 110 in the curved display area A2 is not limited to 6 nm as mentioned-above, but also can be 2 nm, 5 nm, 7 nm or 10 nm, which ranges from 2 nm to 10 nm.

In one embodiment, a recess 113 is defined by a portion of the cathode layer 110 corresponding to the curved display area A2. As shown in FIG. 1, the cathode layer 110 is integrally formed. The recess 113 is defined by the portion of the cathode layer 110 of the curved display area A2 disposed on both sides of planar display area A1, respectively. An opening area of the recess 113 is equal to an area of the curved display area A2, so that the thickness of the cathode layer 110 in the curved display area A2 is less than the thickness in the planar display area A1.

Specifically, a depth of the recess 113 along a thickness direction of the display panel may be 6 nm. In practical applications, the depth of the recess 113 in the thickness direction of the display panel is not limited to 6 nm, but can also be 2 nm, 5 nm, 7 nm or 10 nm, which ranges from 2 nm to 10 nm.

Figure 3:
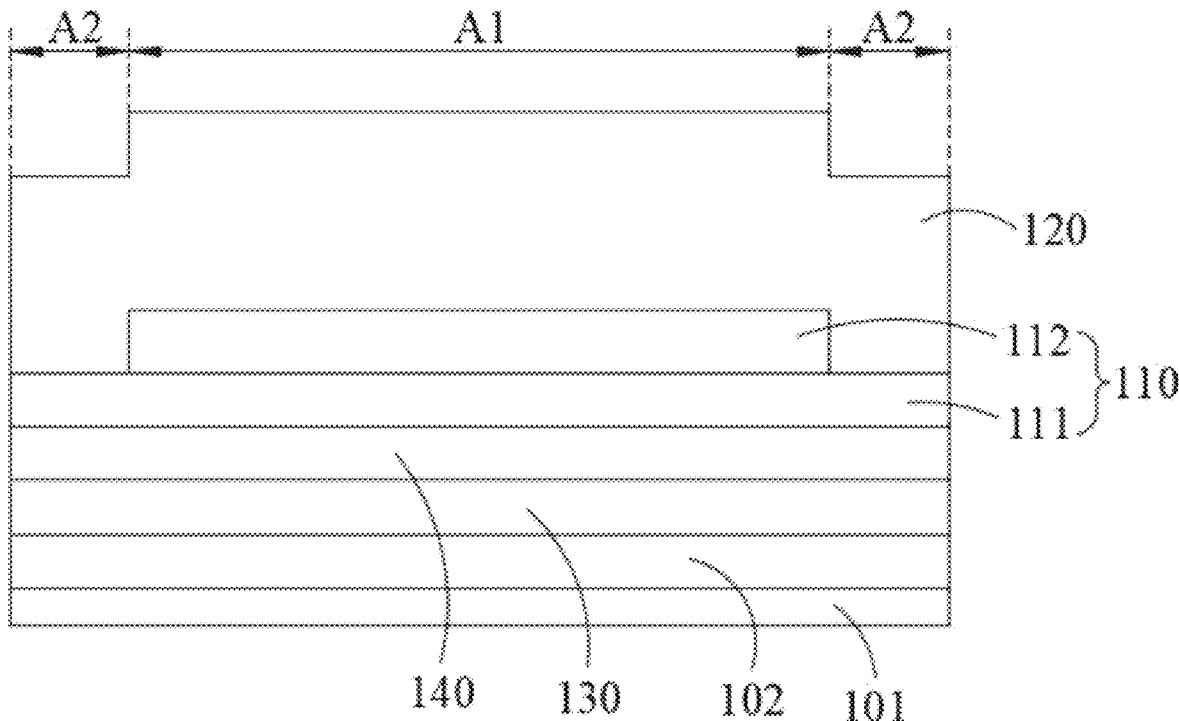
FIG. 3 is a structural schematic diagram of a display panel according to a second embodiment of the disclosure.

In one embodiment, as shown in FIG. 3, a structural schematic diagram of a display panel according to a second embodiment of the disclosure is shown. The cathode layer 110 includes a first cathode layer 111 and a second cathode layer 112, and the first cathode layer 111 is disposed in the planar display area A1 and the curved display area A2. The second cathode layer 112 is disposed between the first cathode layer 111 and the optical coupling layer 120 and is arranged in the planar display area A1. The first cathode layer 111 and the second cathode layer 112 are prepared by two evaporation processes, respectively.

In one embodiment, a thickness of the first cathode layer 111 in the planar display area A1 is equal to a thickness of the first cathode layer 111 in the curved display area A2. A thickness of the second cathode layer 112 in the planar display area A1 is equal. Besides, the thickness of the first cathode layer 111 is 14 nm, and the thickness of the second cathode layer 112 is 6 nm. Therefore, it can be prevented that the resistance of the first cathode layer 111 is too large due to the thickness of the first cathode layer 111 being too thin, which affects the conductive effect of the cathode layer 110. Meanwhile, it can be further prevented that the transmittance of the cathode layer 110 is reduced due to the excessive thickness of the second cathode layer 112, which affects the display effect of the planar display area A1.

In practical applications, the thickness of the first cathode layer 111 is not limited to 14 nm as mentioned-above, but can also be 8 nm, 10 nm, 12 nm, 16 nm, 18 nm or 20 nm, which ranges from 8 nm to 20 nm. The thickness of the second cathode layer 112 is not limited to 6 nm as mentioned-above, but can also be 2 nm, 4 nm, 8 nm or 10 nm, which ranges from 2 nm to 10 nm.

Furthermore, a material of the first cathode layer 111 includes at least one of ytterbium, calcium, magnesium, and silver, and a material of the second cathode layer 112 includes at least one of ytterbium, calcium, magnesium, and silver.

In one embodiment, the material of the first cathode layer 111 is a silver-magnesium alloy with a mole ratio of 10:1. The first cathode layer is formed by evaporation of active metal magnesium with low work function and chemically stable metal silver with high work function, which can not only form a stable and solid alloy electrode on the light emitting layer 140, but also improve the quantum efficiency and stability of OLED devices. The second cathode layer 112 is made of the same material as the first cathode layer 111, and is also a silver-magnesium alloy with a mole ratio of 10:1. In practical applications, the materials of the first cathode layer 111 and the second cathode layer 112 are not limited to the silver-magnesium alloy as mentioned above. The material of the first cathode layer 111 may include at least one of ytterbium, calcium, magnesium, and silver, and the material of the second cathode layer 112 includes at least one of ytterbium, calcium, magnesium, and silver. The materials of the first cathode layer 111 and the second cathode layer 112 can be the same or different.

In one embodiment, the material of the first cathode layer 111 is different from that of the second cathode layer 112, and the refractive index of the first cathode layer 111 is less than that of the second cathode layer 112. For example, the first cathode layer 111 can be made of silver-magnesium alloy, and the second cathode layer 112 can be made of silver or other metal materials with a large refractive index. Therefore, the light emitted by the light emitting layer 140 can be prevented from being totally reflected when transmitting from the first cathode layer 111 to the second cathode layer 112, thereby ensuring the brightness and display effect of the display panel in the planar display area A1. In practical applications, the refractive index of the first cathode layer 111 can also be greater than or equal to the refractive index of the second cathode layer 112.

Furthermore, the thickness of the optical coupling layer 120 in the curved display area A2 is greater than or equal to the thickness of the optical coupling layer 120 in the planar display area A1.

In one embodiment, as shown in FIG. 1 and FIG. 3, the thickness of the optical coupling layer 120 in the curved display area A2 is equal to the thickness of the optical coupling layer 120 in the planar display area A1.

Figure 4:
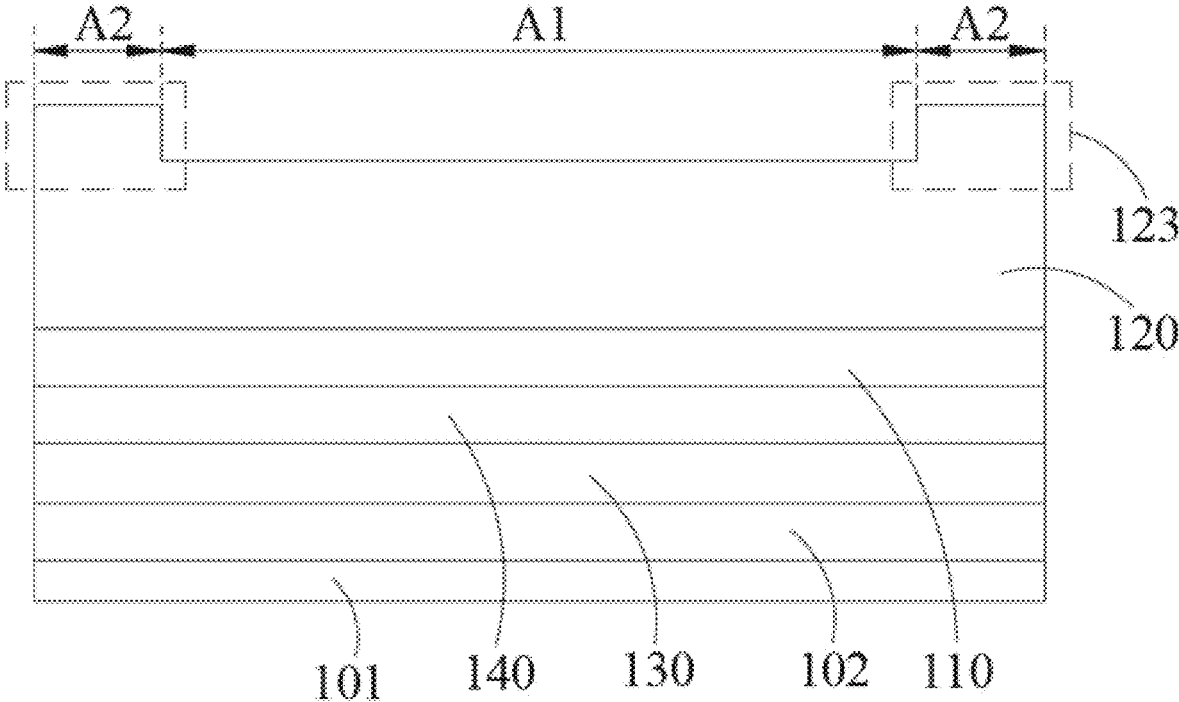
FIG. 4 is a structural schematic diagram of a display panel according to a third embodiment of the disclosure.

In one embodiment, as shown in FIG. 4, a structural schematic diagram of a display panel according to a third embodiment of the disclosure is shown. The difference between the structure of the first embodiment of the display panel shown in FIG. 1 and the second embodiment of the display panel shown in FIG. 3 is that in the third embodiment of the display panel shown in FIG. 4, the thickness of the cathode layer 110 in the planar display area A1 is equal to the thickness of the cathode layer 110 in the curved display area A2. The thickness of the optical coupling layer 120 in the curved display area A2 is greater than that of the optical coupling layer 120 in the planar display area A1.

Figure 5:
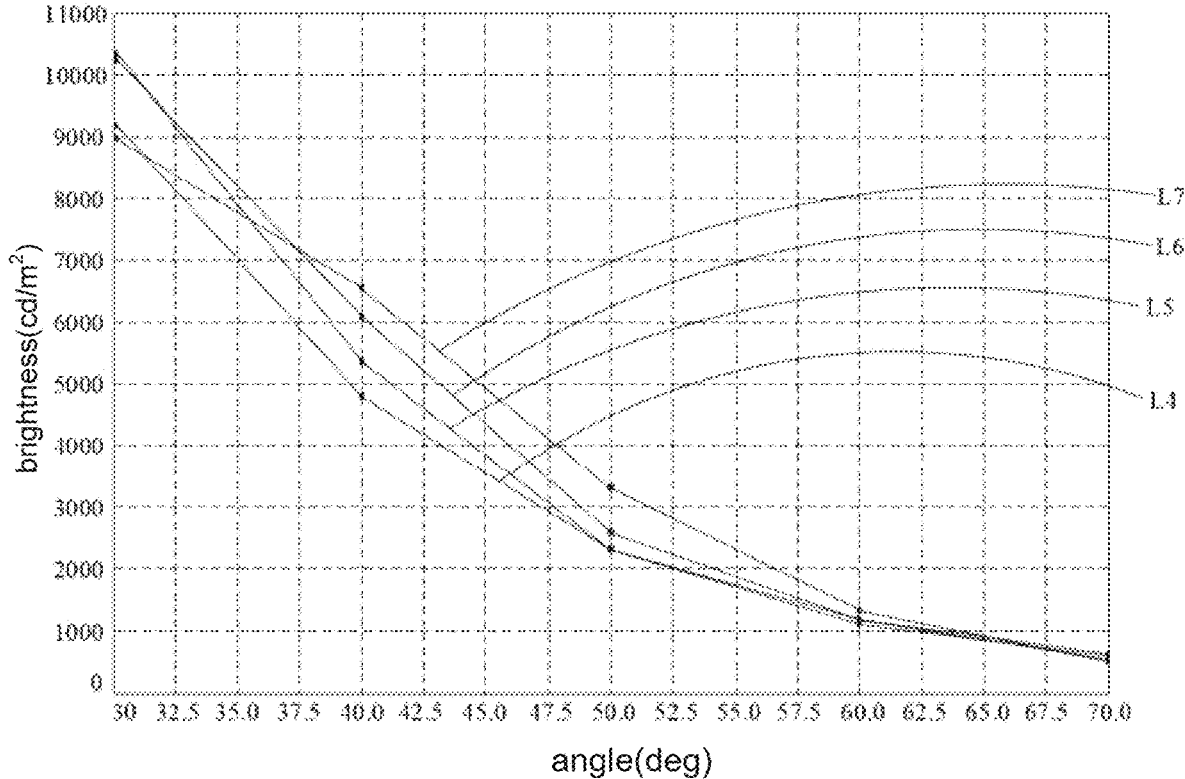
FIG. 5 is a schematic diagram of simulated brightness curves of a curved display area at different thicknesses of an optical coupling layer and different observation angles according to an embodiment of the disclosure.

Combining FIG. 5 and Table 2, a schematic diagram of simulated brightness curves of a curved display area at different thicknesses of an optical coupling layer and different observation angles according to an embodiment of the disclosure is shown in FIG. 5, and a table of simulated brightness values of the curved display area with different thicknesses of the optical coupling layer is shown in Table 2. In this experiment, the thickness of the cathode layer 110 in the curved display area A2 is a fixed value of 13 nm. The embodiment includes four control groups: a fourth group L4, the thickness of the optical coupling layer 120 in the curved display area A2 is 80 nm; a fifth group L5, the thickness of the optical coupling layer 120 in the curved display area A2 is 100 nm; a sixth group, the thickness of the optical coupling layer 120 in the curved display area A2 is 120 nm; and a seventh group, the thickness of the optical coupling layer 120 in the curved display area A2 is 150 nm.

Referring to FIG. 5, as the observation angle changes from 30° to 70°; the brightness of the four control groups gradually decreases with the observation angle increased gradually. Besides, when the observation angle is greater than 37.5° and less than 50°, the thickness of the optical coupling layer 120 is greater, the brightness of the curved display area A2 is also greater. Referring to Table 2, when the observation angle is 50°, the brightness of the fourth group L4 is 2200 cd/m$^2$, the brightness of the fifth group L5 is 2200 cd/m$^2$, the brightness of the sixth group L6 is 2500 cd/m$^2$, and the brightness of the seventh group L7 is 3300 cd/m$^2$. Accordingly, under the premise of a large viewing angle, if the thickness of the optical coupling layer 120 in the curved display area A2 is greater, the brightness of the curved display area A2 will also be greater.

TABLE 2 a table of simulated brightness values of the curved display area with different thicknesses of the optical coupling layer

| Thickness of optical coupling layer in curved display area/nm | Brightness (observation angle 50°)/cd/m$^2$ |
| --- | --- |
| 80 | 2200 |
| 100 | 2200 |
| 120 | 2500 |
| 150 | 3300 |

Further, the difference between the thickness of the optical coupling layer 120 in the curved display area A2 and the thickness of the optical coupling layer 120 in the planar display area A1 is greater than or equal to 10 nm.

In one embodiment, the difference between the thickness of the optical coupling layer 120 in the curved display area A2 and the thickness of the optical coupling layer 120 in the planar display area A1 is 20 nm. Referring to FIG. 4 and Table 2, If the difference between the thickness of the optical coupling layer 120 in the curved display area A2 and the thickness of the optical coupling layer 120 in the planar display area A1 is less than 10 nm, the brightness of the display panel in the curved display area A2 and the planar display area A1 is equal or not much different. The difference between the thickness of the optical coupling layer 120 in the curved display area A2 and the thickness of the optical coupling layer 120 in the planar display area A1 is limited to 20 nm, which can effectively improve the brightness of the display panel in the curved display area A2, thereby reducing the brightness difference between the curved display area A2 and the planar display area A1 of the display panel In practical applications, the difference between the thickness of the optical coupling layer in the curved display area A2 and the thickness of the optical coupling layer 120 in the planar display area A1 is not limited to 20 nm as mentioned-above, and can also be 11 nm, 15 nm, or 30 nm, as long as it is greater than 10 nm.

In one embodiment, at least one protrusion 123 is disposed on the portion of the optical coupling layer 120 on a side away from the cathode layer 110 corresponding to the curved display area A2. As shown in FIG. 4, the optical coupling layer 120 is integrally formed. The protrusions are arranged on two sides of the two curved display areas A2 of the optical coupling layer 120 disposed on both sides of the planar display area A1 away from the cathode layer 110. The protrusion 123 belongs to a part of the optical coupling layer 120, so that the thickness of the optical coupling layer 120 in the curved display area A2 is greater than the thickness of the optical coupling layer 120 in the planar display area A1.

Specifically, in the thickness direction of the display panel, the thickness of the protrusion 123 is 20 nm. In practical application, the thickness of the protrusion along the thickness direction of the display panel is not limited to 20 nm, but can also be 11 nm, 15 nm, 30 nm, etc., as long as it is greater than 10 nm.

Further, the optical coupling layer 120 includes a first optical coupling layer 121 and a second optical coupling layer 122, the first optical coupling layer 121 is arranged in the curved display area A2, and the second optical coupling layer 122 is arranged in the curved display area A2 and the planar display area A1. The first optical coupling layer 121 is disposed between the second optical coupling layer 122 and the cathode layer 110. Alternatively, the first optical coupling layer 121 is disposed on a side of the second optical coupling layer 122 away from the cathode layer 110.

Figure 6:
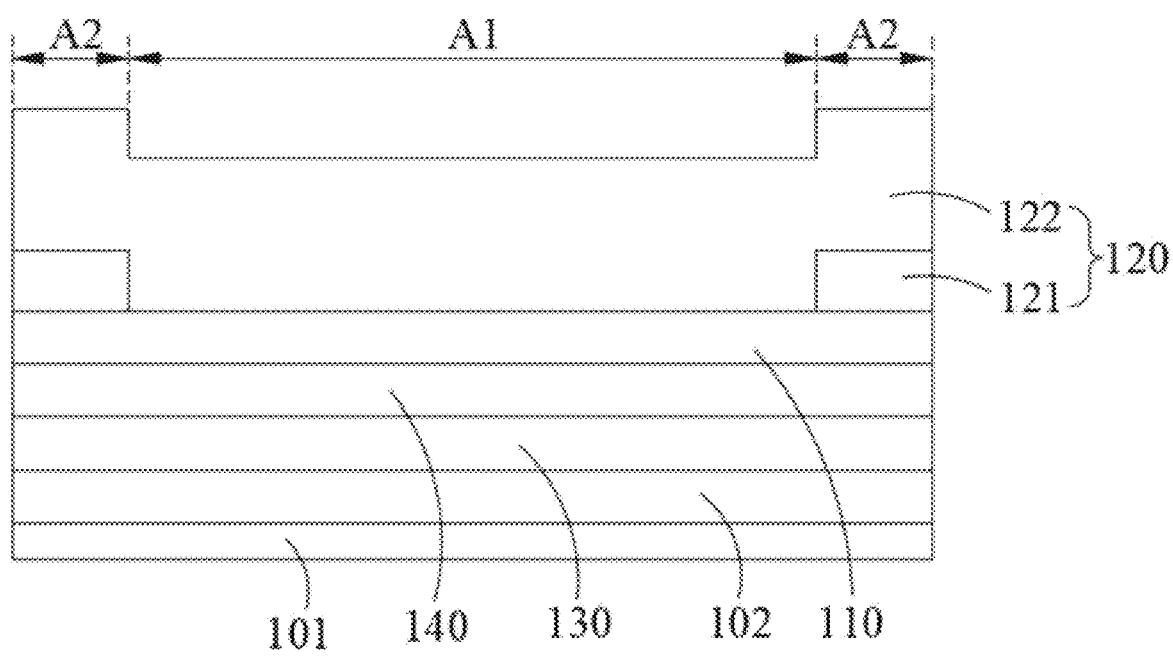
FIG. 6 is a structural diagram of a display panel according to a fourth embodiment of the disclosure.

In one embodiment, as shown in FIG. 6, a structural diagram of a display panel according to a fourth embodiment of the disclosure is shown. The optical coupling layer 120 includes a first optical coupling layer 121 and a second optical coupling layer 122, the first optical coupling layer 121 is disposed in the curved display area A2, and the second optical coupling layer 122 is disposed in the planar display area A1 and the curved display area A2. The first optical coupling layer 121 is disposed between the second optical coupling layer 122 and the cathode layer 110. In practical applications, the position of the first optical coupling layer 121 is not limited to being disposed between the second optical coupling layer 122 and the cathode layer 110, and can also be disposed on a side of the second optical coupling layer 122 away from the cathode layer 110. In this way, the thickness of the optical coupling layer 120 in the curved display area A2 can also be greater than the thickness of the optical coupling layer 120 in the planar display area A1.

Further, the thickness of the first optical coupling layer 121 is greater than or equal to 10 nm and less than or equal to 60 nm, and the thickness of the second optical coupling layer 122 is greater than or equal to 50 nm and less than or equal to 200 nm.

In one embodiment, the thickness of the first optical coupling layer 121 is 20 nm, and the thickness of the second optical coupling layer 122 is 100 nm. The thickness difference between the second optical coupling layer 122 and the first optical coupling layer 121 is 20 nm. According to Table 2, the brightness of the display panel in the curved display area A2 is greater than the brightness in the planar display area A1. In practical application, the thickness of the first optical coupling layer 121 is not limited to 20 nm as mentioned-above, but can also be 10 nm, 40 nm or 60 nm, which ranges from 10 nm to 60 nm. The thickness of the second optical coupling layer 122 is not limited to 100 nm as mentioned-above, but can also be 50 nm, 80 nm, 120 nm, 150 nm, 180 nm or 200 nm, which ranges from 50 nm to 100 nm.

Further, the materials of the first optical coupling layer 121 and the second optical coupling layer 122 are organic small molecule hole transport materials.

In one embodiment, the materials of the first optical coupling layer 121 and the second optical coupling layer 122 are the same, both of which are NPB. In practical applications, the materials of the first optical coupling layer 121 and the second optical coupling layer 122 may also be organic small molecule hole transport materials such as 2TNATA.

In one embodiment, the material of the first optical coupling layer 121 is different from the material of the second optical coupling layer 122, and the refractive index of the first optical coupling layer 121 is greater than that of the second optical coupling layer 122, so that the first optical coupling layer 121 and the second optical coupling layer 122 form a stacked structure with a graded refractive index. The internal reflection loss of light in the curved display area A2 is reduced, and the exit angle of the light emitted by the OLED device in the curved display area A2 is increased, thereby further improving the brightness of the curved display area A2 at a large viewing angle. In practical application, the refractive index of the first optical coupling layer 121 may also be less than or equal to the refractive index of the second optical coupling layer 122, which is not limited herein.

In one embodiment, the thickness of the cathode layer 110 in the curved display area A2 is less than the thickness of the cathode layer 110 in the planar display area A1, and the thickness of the optical coupling layer 120 in the curved display area A2 is greater than the thickness of the optical coupling layer 120 in the planar display area A1.

Figure 7:
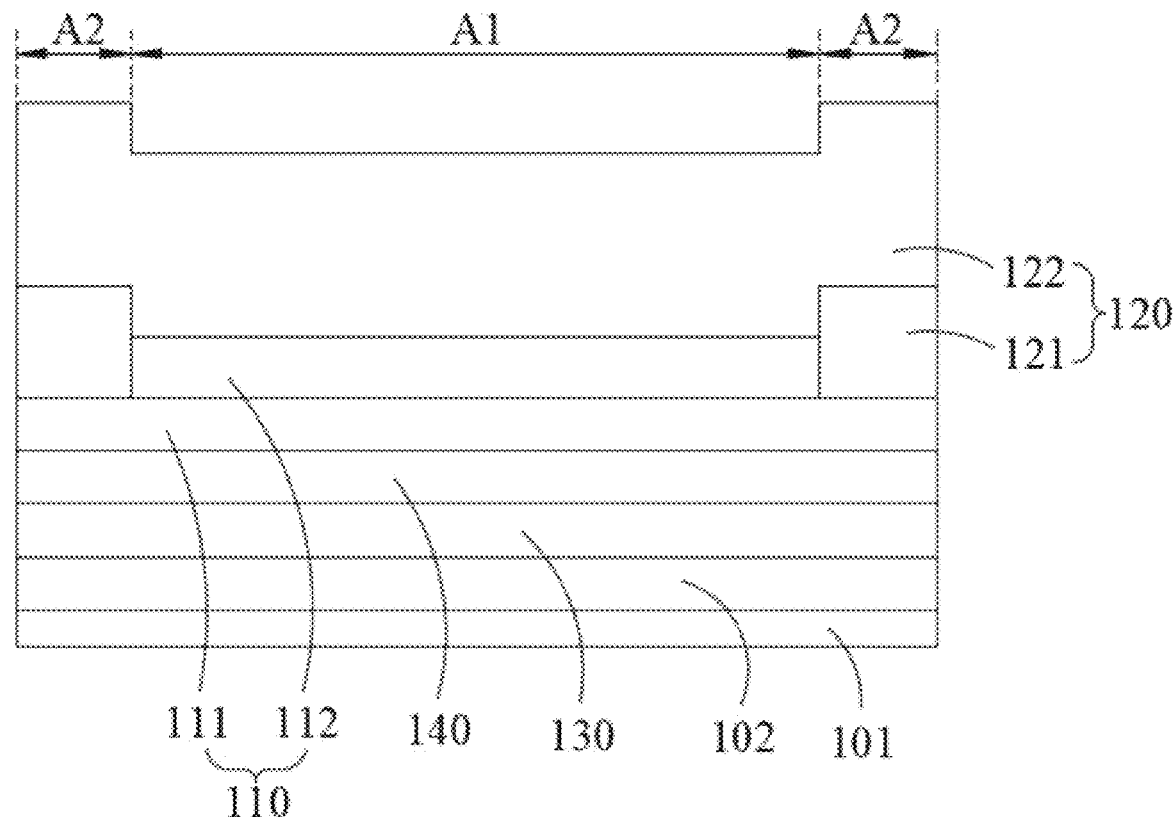
FIG. 7 is a structural diagram of a display panel according to a fifth embodiment of the disclosure.

Specifically, as shown in FIG. 7, a structural diagram of a display panel according to a fifth embodiment of the disclosure is shown. The cathode layer 110 includes a first cathode layer 111 and a second cathode layer 112. The first cathode layer 111 is disposed in the planar display area A1 and the curved display area A2, and is disposed on the light emitting layer 140. The thickness of the first cathode layer 111 in the planar display area A1 is equal the thickness of the first cathode layer 111 in the curved display area A2. The second cathode layer 112 is only disposed in the curved display area A2 and disposed on the first cathode layer 111, and the thickness of the second cathode layer 112 in the curved display area A2 is equal.

Further, the thickness of the first cathode layer 111 is between 8 nm to 20 nm, and the thickness of the second cathode layer 112 is between 2 nm to 10 nm. The thickness of the first cathode layer 111 and the second cathode layer 112 may be equal to the thickness of the first cathode layer 111 and the second cathode layer 112 in the first embodiment of the display panel shown in FIG. 3, and will not be repeated herein.

The optical coupling layer 120 includes a first optical coupling layer 121 and a second optical coupling layer 122. The first optical coupling layer 121 is only disposed on the curved display area A2 and is disposed on the first cathode layer 111. The thickness of the first optical coupling layer 121 in the curved display area A2 is equal. The second optical coupling layer 122 is disposed in the planar display area A1 and the curved display area A2, and covers the second cathode layer 112 and the first optical coupling layer 121. The thickness of the second optical coupling layer 122 in the planar display area A1 is equal to the thickness of the second optical coupling layer 122 in the curved display area A2. Therefore, the thickness of the cathode layer 110 in the curved display area A2 is reduced, and the thickness of the optical coupling layer 120 in the curved display area A2 is increased to reduce the microcavity effect of the microcavity structure in the curved display area A2. The brightness of the curved display area A2 under a large viewing angle is improved, so that the problem of the curved display area A2 being lower than the planar display area A1 can be improved.

Further, the thickness of the first optical coupling layer 121 is between 10 nm to 60 nm, and the thickness of the second optical coupling layer 122 is between 50 nm to 200 nm. The thickness of the first optical coupling layer 121 and the second optical coupling layer 122 may be equal to the thickness of the first optical coupling layer 121 and the second optical coupling layer 122 in the second embodiment of the display panel shown in FIG. 3, which will not be repeated herein.

It should be noted that the materials of the first cathode layer 111, the second cathode layer 112, the first optical coupling layer 121 and the second optical coupling layer 122 of the display panel shown in FIG. 3 and FIG. 6 are also applicable to the first cathode layer 111, the second cathode layer 112, the first optical coupling layer 121 and the second optical coupling layer 122 in the third embodiment of the display panel shown in FIG. 7, which will not be repeated herein.

Figure 8:
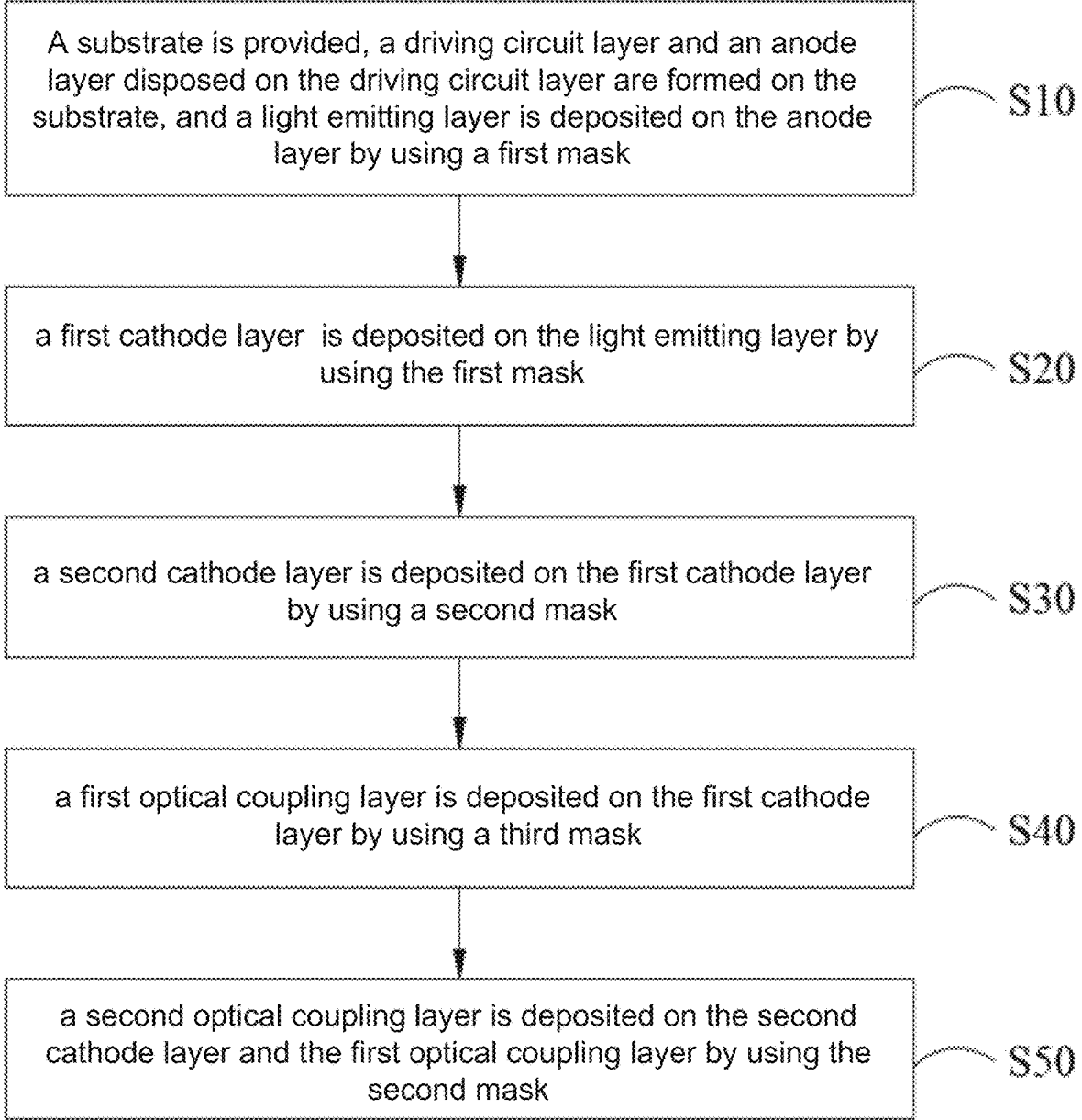
FIG. 8 is a flowchart of a manufacturing method of the display panel according to the first embodiment of the disclosure.
Figure 9:
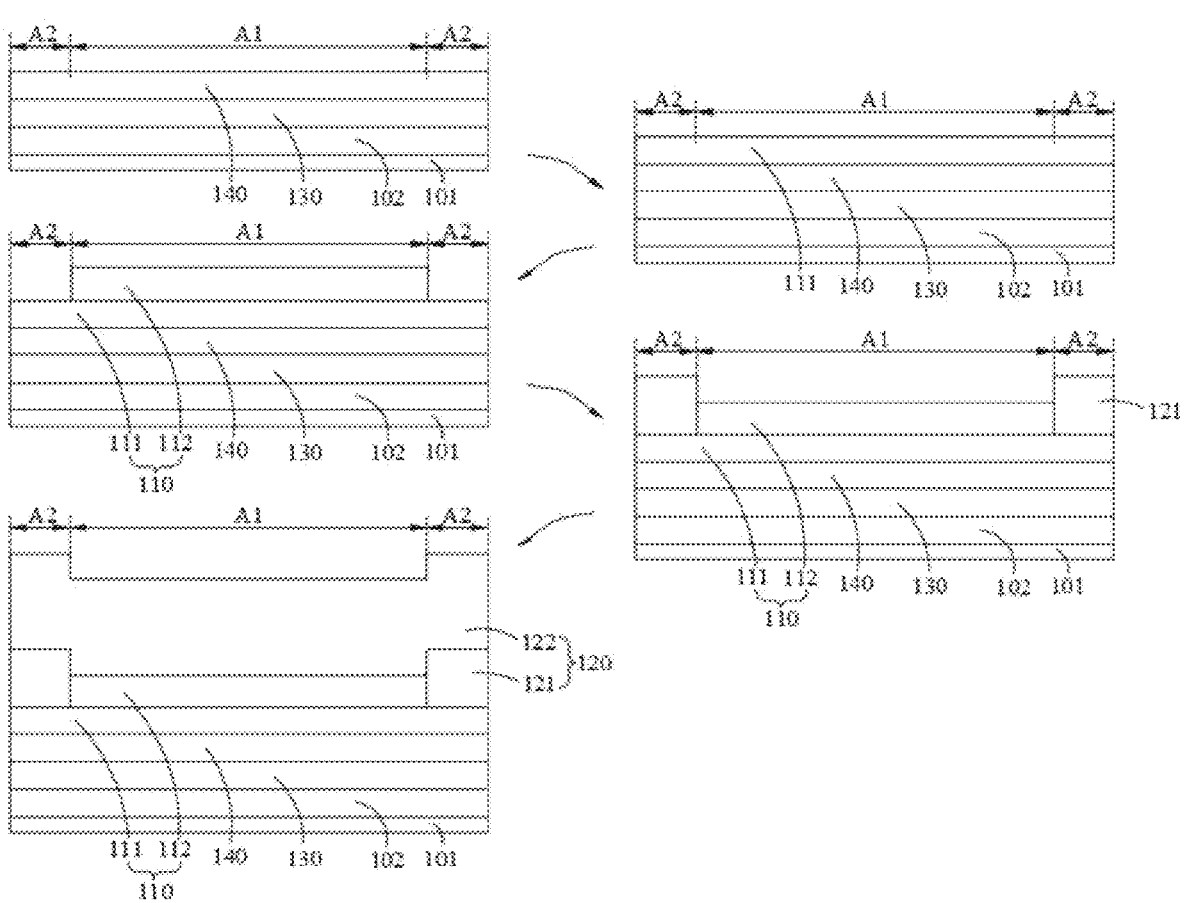
FIG. 9 is a schematic flowchart of the manufacturing method of the display panel according to the first embodiment of the disclosure.

An embodiment of the disclosure further provides a manufacturing method of a display panel, which will be described in detail below with reference to FIG. 8 and FIG. 9. A flowchart of a manufacturing method of the display panel according to the first embodiment of the disclosure is shown in FIG. 8, and a schematic flowchart of the manufacturing method of the display panel according to the first embodiment of the disclosure is shown in FIG. 9. The manufacturing method comprises following steps.

In a step S10, a substrate 101 is provided. A driving circuit layer 102 and an anode layer 130 disposed on the driving circuit layer are formed on the substrate 101, and a light emitting layer 140 is deposited on the anode layer 130 by using a first mask 21.

Figure 10:
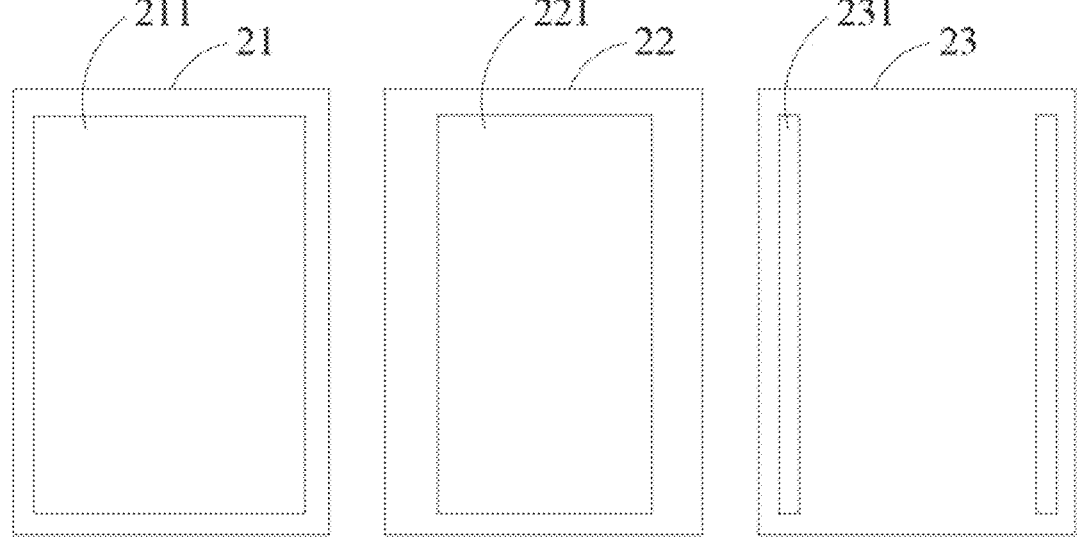
FIG. 10 is a schematic structural diagram of a mask according to an embodiment of the disclosure.

Specifically, as shown in FIG. 10, a schematic structural diagram of a mask according to an embodiment of the disclosure is shown. The first mask 21 includes a light transmitting area 211 corresponding to the planar display area A1 and the curved display area A2 of the display panel in FIG. 9. In the step S10, the light emitting layer 140 is disposed in the planar display area A1 and the curved display area A2, and the thickness of the light emitting layer 140 in the planar display area A1 is equal to the thickness of the light emitting layer 140 in the curved display area A2.

In a step S20: a first cathode layer 111 is deposited on the light emitting layer 140 by using the first mask 21.

Specifically, in the step S20, the first mask 21 is used to deposit the first cathode layer 111 on the light emitting layer 140. The first cathode layer 111 is disposed in the planar display area A1 and the curved display area A2, and the thickness of the first cathode layer 111 in the planar display area A1 is equal to the thickness of the first cathode layer 111 in the curved display area A2.

In a step S30: a second cathode layer 112 is deposited on the first cathode layer 111 by using a second mask 22.

Specifically, as shown in FIG. 10, the second mask 22 includes a second light transmitting area 221 corresponding to the planar display area A1 in FIG. 9. In the step S30, the second cathode layer 112 is deposited through the second mask 22 so that the second cathode layer 112 is only formed in the planar display area A1. Therefore, the thickness of the cathode layer 110 in the curved display area A2 is less than the thickness of the cathode layer 110 in the planar display area A1.

In a step S40: a first optical coupling layer 121 is deposited on the first cathode layer 111 by using a third mask 23.

Specifically, as shown in FIG. 10, the third mask 23 includes a third light transmitting area 231 corresponding to the curved display area A2 in FIG. 9. In the step S40, the first optical coupling layer 121 is deposited on the first cathode layer 111 using the third mask 23 so that the first optical coupling layer 121 is formed only in the curved display area A2.

In a step S50: a second optical coupling layer 122 is deposited on the second cathode layer 112 and the first optical coupling layer 121 by using the second mask 22.

Specifically, in the step S40, the second optical coupling layer 122 is deposited on the second cathode layer 112 and the first optical coupling layer 121 using the second mask 22, so that the second optical coupling layer is formed in both the planar display area A1 and the curved display area A2. Therefore, the thickness of the optical coupling layer 120 in the curved display area A2 is greater than the thickness of the optical coupling layer 120 in the planar display area A1.

In the manufacturing method of the embodiment of the disclosure, the materials and the thickness of the first cathode layer 111, the second cathode layer 112, the first optical coupling layer 121 and the second optical coupling layer 122 is the same as the materials and the thickness of the first cathode layer 111, the second cathode layer 112, the first optical coupling layer 121 and the second optical coupling layer 122 in the third embodiment of the display panel shown in FIG. 9, which will not be repeated herein.

In the manufacturing method of the embodiment of the disclosure, the thickness of the cathode layer 110 in the curved display area A2 is reduced, and the thickness of the optical coupling layer 120 in the curved display area A2 is increased to reduce the microcavity effect of the microcavity structure in the curved display area A2. The brightness of the curved display area A2 at a large viewing angle is improved, so that the problem of the curved display area A2 being lower than the planar display area A1 can be improved.

An embodiment of the disclosure further provides a manufacturing method of a display panel, which will be described in detail below with reference to FIG. 11 and FIG. 12. A flowchart of a manufacturing method of the display panel according to the second embodiment of the disclosure is shown in FIG. 11, and a schematic flowchart of the manufacturing method of the display panel according to the second embodiment of the disclosure is shown in FIG. 12. The manufacturing method comprises following steps.

In a step S10, a substrate 101 is provided. A driving circuit layer 102 and an anode layer 130 disposed on the driving circuit layer are formed on the substrate 101, and a light emitting layer 140 is deposited on the anode layer 130 by using a first mask 21.

Specifically, as shown in FIG. 10, the first mask 21 includes a light transmitting area 211 corresponding to the planar display area A1 and the curved display area A2 of the display panel in FIG. 9. In the step S10, the light emitting layer 140 is disposed in the planar display area A1 and the curved display area A2, and the thickness of the light emitting layer 140 in the planar display area A1 is equal to the thickness of the light emitting layer 140 in the curved display area A2.

In a step S20: a first cathode layer 111 is deposited on the light emitting layer 140 by using the first mask 21.

Specifically, in the step S20, the first mask 21 is used to deposit the first cathode layer 111 on the light emitting layer 140. The first cathode layer 111 is disposed in the planar display area A1 and the curved display area A2, and the thickness of the first cathode layer 111 in the planar display area A1 is equal to the thickness of the first cathode layer 111 in the curved display area A2.

In a step S30: a second cathode layer 112 is deposited on the first cathode layer 111 by using a second mask 22.

Specifically, as shown in FIG. 10, the second mask 22 includes a second light transmitting area 221, and the second light transmitting area 221 corresponds to the planar display area A1 in FIG. 12. In the step S30, the second cathode layer 112 is deposited through the second mask 22 so that second cathode layer 112 is formed only in the planar display area A1. Therefore, the thickness of the cathode layer in the curved display area A2 is less than the thickness of the cathode layer in the planar display area A1.

In a step S40: an optical coupling layer 120 is deposited on the first cathode layer 111 and the second cathode layer 112 using the first mask 21.

Specifically, in the step S40, the optical coupling layer 120 is deposited on the first cathode layer 111 and the second cathode layer 112 by using the first mask 21. The optical coupling layer 120 is formed in both the planar display area A1 and the curved display area A2, and the thickness of the optical coupling layer 120 in the planar display area A1 is equal to the thickness of the optical coupling layer 120 in the curved display area A2.

In the manufacturing method of the embodiment of the disclosure, the materials and the thickness of the first cathode layer 111, the second cathode layer 112 and the optical coupling layer 120 is the same as the materials and the thickness of the first cathode layer 111, the second cathode layer 112 and the optical coupling layer 120 in the first embodiment of the display panel shown in FIG. 1, which will not be repeated herein.

In the manufacturing method of the embodiment of the disclosure, the thickness of the cathode layer 110 in the curved display area A2 is reduced, and the thickness of the optical coupling layer 120 in the curved display area A2 is increased to reduce the microcavity effect of the microcavity structure in the curved display area A2. The luminous efficiency of the light emitting layer 140 in the curved display area A2 is improved so that the luminous efficiency of the light emitting layer 140 in the curved display area A2 is greater than the luminous efficiency of the light emitting layer 140 in the planar display area A1. Accordingly, the brightness of the curved display area A2 at a large viewing angle is improved, so that the problem of the curved display area A2 being lower than the planar display area A1 can be improved.

Figure 13:
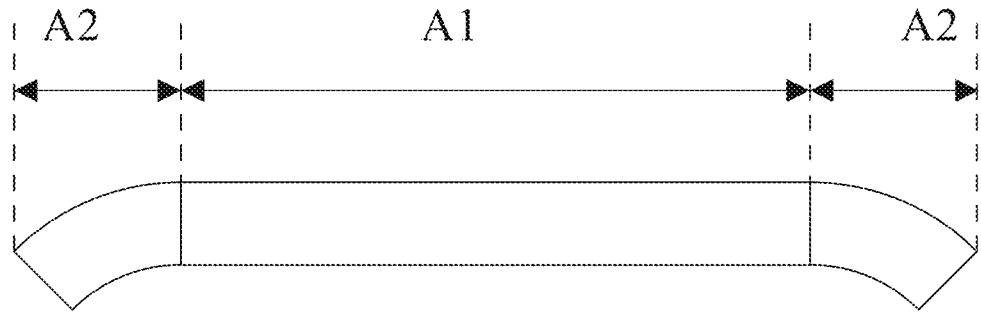
FIG. 13 schematically shows an overall cross-sectional view of a display panel subjected to a bending process of a procedure of manufacturing the display panel.

FIG. 13 schematically shows an overall cross-sectional view of a display panel subjected to a bending process of a procedure of manufacturing the display panel. After the bending process, the curved display area A2 of the display panel will bend from the connection between the curved display area A2 and the planar display area A1 of the display panel to form a desired curved structure.

The embodiment of the disclosure further provides a display device. The display device includes a display panel, which can be the display panel provided by the above embodiments. The display panel in the display device provided by the embodiment of the disclosure can achieve the same technical effect as the display panel in the above embodiments, which will not be repeated herein.

The embodiment of the disclosure provides a display panel, a manufacturing method and a display device thereof. The display panel includes a light emitting layer, a cathode layer, and an optical coupling layer. A thickness of at least one of the cathode layer and the optical coupling layer in the curved display area is different from a thickness of at least one of the cathode layer and the optical coupling layer in the planar display area. The luminous efficiency of the light emitting layer in the curved display area is greater than the luminous efficiency in the planar display area, thereby improving the brightness of the curved display area. The problem that the brightness of the display panel in the curved display area is lower than the brightness of the planar display area is improved.

It can be understood that, for those of ordinary skill in the art, equivalent replacements or changes can be made according to the technical solution of the present application and its inventive concept, and all these changes or replacements shall fall within the protection scope of the appended claims of the present application.

What is claimed is:

1. A display panel, comprising a planar display area and a curved display area disposed on at least one side of the planar display area, wherein the display panel comprises:
   a light emitting layer;
   a cathode layer disposed on the light emitting layer and covering the light emitting layer, wherein the cathode layer has a substantially uniform thickness throughout the planar display area in a direction; and
   an optical coupling layer disposed on a side of the cathode layer away from the light emitting layer,
   wherein the cathode layer in the curved display area has a thickness less than the substantially uniform thickness of the cathode layer in the planar display area and the optical coupling layer in the curved display area has a thickness greater than or equal to a thickness of the optical coupling layer in the planar display area, so that the light emitting layer in the curved display area has a light-emitting efficiency greater than a light-emitting efficiency of the light emitting layer in the planar display area;
   the cathode layer comprises: a first cathode sub-layer disposed in the planar display area and the curved display area; and a second cathode sub-layer disposed between the first cathode sub-layer and the optical coupling layer and disposed in the planar display area; and
   the first cathode sub-layer has a material different from the second cathode sub-layer, and a refractive index of the first cathode sub-layer is less than or equal to a refractive index of the second cathode sub-layer or the refractive index of the first cathode sub-layer is greater than or equal to the refractive index of the second cathode sub-layer.

2. The display panel according to claim 1, wherein a difference between the thickness of the cathode layer in the planar display area and the thickness of the cathode layer in the curved display area is greater than or equal to 2 nm and less than or equal to 10 nm.

3. The display panel according to claim 1, wherein the cathode layer has a recess in the curved display area.

4. The display panel according to claim 1, wherein the material of the first cathode sub-layer includes at least one of ytterbium, calcium, magnesium or silver, and the material of the second cathode sub-layer includes at least one of ytterbium, calcium, magnesium or silver.

5. The display panel according to claim 1, wherein a difference between the thickness of the optical coupling layer in the curved display area and the thickness of the optical coupling layer in the planar display area is greater than or equal to 10 nm.

6. The display panel according to claim 1, wherein the optical coupling layer has a protrusion on a side away from the cathode layer in the curved display area.

7. The display panel according to claim 1, wherein the optical coupling layer comprises:
   a first optical coupling sub-layer disposed in the curved display area and not in the planar display area; and
   a second optical coupling sub-layer disposed in both the curved display area and the planar display area,
   wherein the first optical coupling sub-layer is disposed between the second optical coupling sub-layer and the cathode layer, or the first optical coupling sub-layer is disposed on a side of the second optical coupling sub-layer away from the cathode layer.

8. The display panel according to claim 7, wherein the first optical coupling sub-layer has a thickness greater than or equal to 10 nm and less than or equal to 60 nm, and the second optical coupling sub-layer has a thickness greater than or equal to 50 nm and less than or equal to 200 nm.

9. The display panel according to claim 7, wherein the first optical coupling sub-layer has a material same as the second optical coupling sub-layer.

10. The display panel according to claim 9, wherein each of the first optical coupling sub-layer and the second optical coupling sub-layer has an organic small molecule hole transport material.

11. The display panel according to claim 7, wherein the first optical coupling sub-layer has a material different from the second optical coupling sub-layer, a refractive index of the first optical coupling sub-layer is greater than or equal to a refractive index of the second optical coupling sub-layer, or the refractive index of the first optical coupling sub-layer is less than or equal to the refractive index of the second optical coupling sub-layer.

12. The display panel according to claim 1, wherein a thickness of the first cathode sub-layer is greater than or equal to 8 nm and less than or equal to 20 nm, and a thickness of the second cathode sub-layer is greater than or equal to 2 nm and less than or equal to 10 nm.

13. A display device, comprising a display panel, the display panel comprising a planar display area and a curved display area disposed on at least one side of the planar display area, wherein the display panel comprises:
   a light emitting layer;
   a cathode layer disposed on the light emitting layer and covering the light emitting layer, wherein the cathode layer has a substantially uniform thickness throughout the planar display area in a direction; and
   an optical coupling layer disposed on a side of the cathode layer away from the light emitting layer,
   wherein the cathode layer in the curved display area has a thickness less than the substantially uniform thickness of the cathode layer in the planar display area and the optical coupling layer in the curved display area has a thickness greater than or equal to a thickness of the optical coupling layer in the planar display area, so that the light emitting layer in the curved display area has a light-emitting efficiency greater than a light-emitting efficiency of the light emitting layer in the planar display area;
   the cathode layer comprises: a first cathode sub-layer disposed in the planar display area and the curved display area; and a second cathode sub-layer disposed between the first cathode sub-layer and the optical coupling layer and disposed in the planar display area; and
   the first cathode sub-layer has a material different from the second cathode sub-layer, and a refractive index of the first cathode sub-layer is less than or equal to a refractive index of the second cathode sub-layer or the refractive index of the first cathode sub-layer is greater than or equal to the refractive index of the second cathode sub-layer.

14. The display device according to claim 13, wherein a difference between the thickness of the cathode layer in the planar display area and the thickness of the cathode layer in the curved display area is greater than or equal to 2 nm and less than or equal to 10 nm.

15. The display device according to claim 13, wherein the cathode layer has a recess in the curved display area.

16. The display device according to claim 13, wherein the optical coupling layer comprises:

a first optical coupling sub-layer disposed in the curved display area and not in the planar display area; and a second optical coupling sub-layer disposed in both the curved display area and the planar display area, wherein the first optical coupling sub-layer is disposed between the second optical coupling sub-layer and the cathode layer, or the first optical coupling sub-layer is disposed on a side of the second optical coupling sub-layer away from the cathode layer.

* * * * *